United States Patent
Farjadrad et al.

(10) Patent No.: US 11,233,603 B2
(45) Date of Patent: *Jan. 25, 2022

(54) HIGH-SPEED ETHERNET CODING

(71) Applicant: Marvell Asia Pte, Ltd., Santa Clara, CA (US)

(72) Inventors: Ramin Farjadrad, Los Altos, CA (US); Paul Langner, Fremont, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/888,538

(22) Filed: May 29, 2020

(65) Prior Publication Data
US 2020/0403726 A1     Dec. 24, 2020

Related U.S. Application Data

(63) Continuation of application No. 15/853,504, filed on Dec. 22, 2017, now Pat. No. 10,673,561, which is a continuation of application No. 15/065,753, filed on Mar. 9, 2016, now Pat. No. 9,853,769.

(60) Provisional application No. 62/130,489, filed on Mar. 9, 2015.

(51) Int. Cl.
| | | |
|---|---|---|
| *H04L 1/00* | (2006.01) | |
| *H04L 27/04* | (2006.01) | |
| *H03M 13/29* | (2006.01) | |
| *H03M 13/25* | (2006.01) | |
| *H03M 13/11* | (2006.01) | |
| *H03M 13/15* | (2006.01) | |

(52) U.S. Cl.
CPC ........ *H04L 1/0041* (2013.01); *H03M 13/255* (2013.01); *H03M 13/2906* (2013.01); *H04L 1/007* (2013.01); *H04L 1/0045* (2013.01); *H04L 1/0057* (2013.01); *H04L 27/04* (2013.01); *H03M 13/1102* (2013.01); *H03M 13/1515* (2013.01)

(58) Field of Classification Search
None
See application file for complete search history.

(56) References Cited

U.S. PATENT DOCUMENTS

| | | | |
|---|---|---|---|
| 9,001,872 B1 * | 4/2015 | Farjadrad | H04L 1/0002 375/219 |
| 9,564,990 B1 * | 2/2017 | Tiruvur | H04L 27/04 |
| 2009/0150745 A1 * | 6/2009 | Langner | H03M 13/3707 714/752 |
| 2009/0300469 A1 * | 12/2009 | Rajakarunanayake | H03M 13/3761 714/776 |
| 2013/0058363 A1 * | 3/2013 | Ghiasi | H04L 49/3054 370/514 |

(Continued)

*Primary Examiner* — Mujtaba M Chaudry

(57) ABSTRACT

A BASE-T Ethernet transceiver is disclosed. The transceiver includes a BASE-T Ethernet transmit circuit that employs a data framing module. The data framing module includes an input interface to receive Ethernet block data bits, and, forward error correction encoder is coupled to the logic to encode at least a first portion of the data bits to generate first error check bits. A Reed-Solomon (RS) encoder is coupled to the logic to encode at least a second portion of the data bits in accordance with a Reed-Solomon error code to generate second error check bits. A symbol mapper modulates the Ethernet block data bits in accordance with an SQ64 constellation comprising back-to-back PAM8 symbols.

17 Claims, 9 Drawing Sheets

(56) References Cited

U.S. PATENT DOCUMENTS

| | | | | |
|---|---|---|---|---|
| 2013/0114752 A1* | 5/2013 | Murakami | ............ | H04B 7/0617 375/267 |
| 2015/0207539 A1* | 7/2015 | Chini | .................... | H04L 27/345 375/257 |

* cited by examiner

FIG. 4
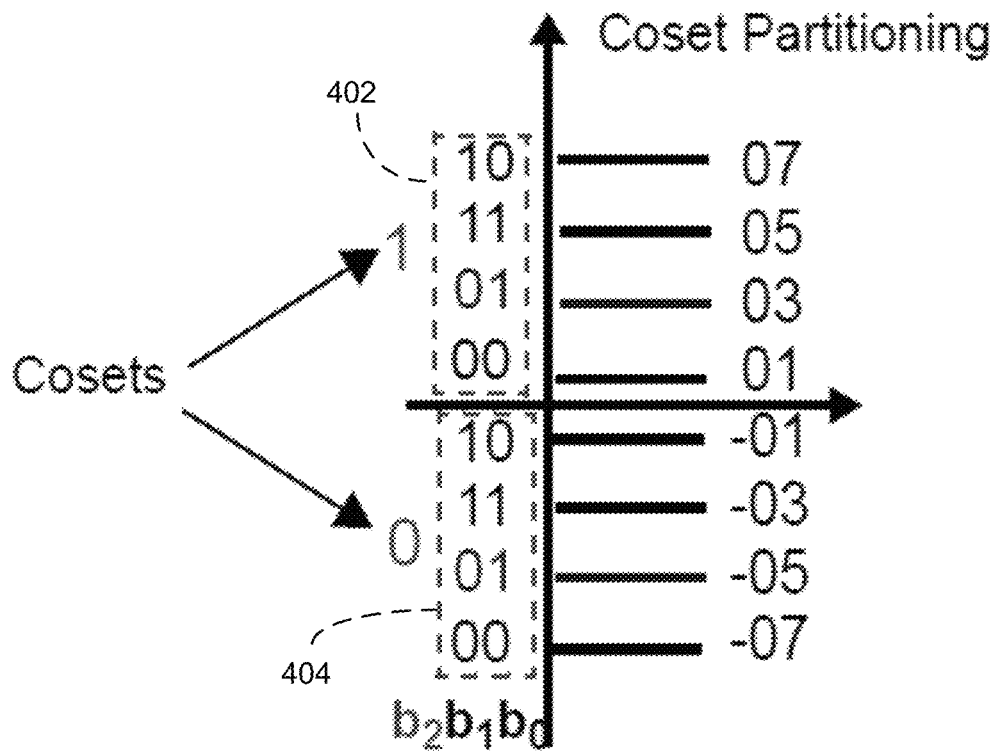
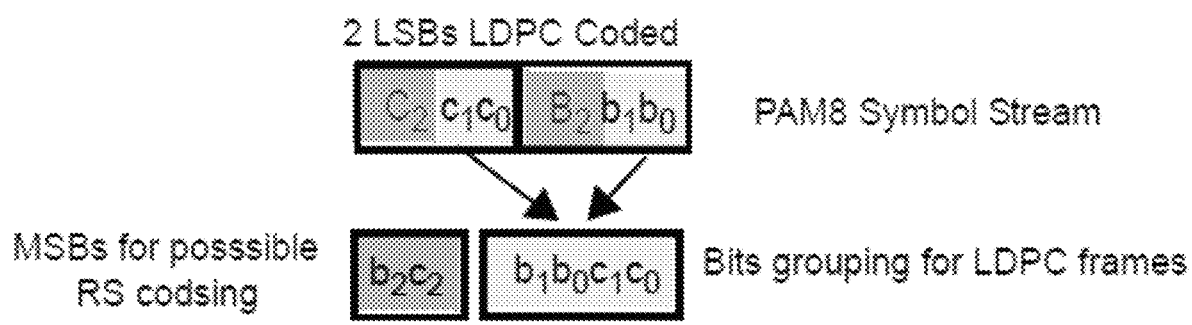

FIG. 5
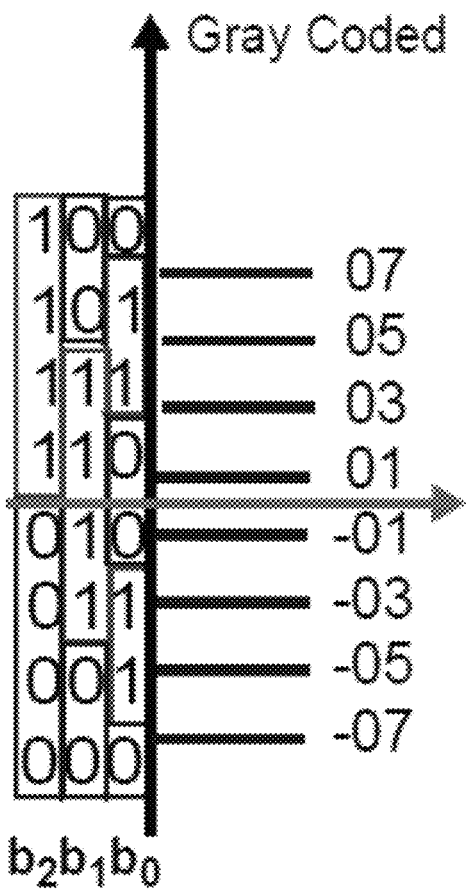
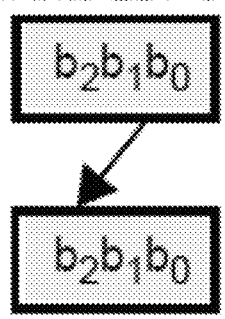

HIGH-SPEED ETHERNET CODING

RELATED APPLICATIONS

This application is a Continuation of U.S. patent application Ser. No. 15/853,504, filed Dec. 22, 2017, entitled HIGH-SPEED ETHERNET CODING, which is a Continuation of U.S. patent application Ser. No. 15/065,753, filed Mar. 9, 2016, entitled HIGH-SPEED ETHERNET CODING, now U.S. Pat. No. 9,853,769, which claims the benefit of Provisional Application No. 62/130,489, filed Mar. 9, 2015, entitled HIGH-SPEED ETHERNET CODING, all of which are expressly incorporated by reference herein.

TECHNICAL FIELD

The disclosure herein relates generally to electronic communications, and more particularly to coding and decoding received data in electronic communications.

BACKGROUND

Transferring information between computers and other electronic devices can be implemented using any of a variety of different standards and technologies. Channel coding and error correction techniques can be used to reduce errors in received signals introduced from distortion and other disturbances. Such coding and error correction can be implemented using an encoder and a decoder at the ends of the transmission channel.

One increasingly popular communication standard is 10 Gigabit Ethernet, with a nominal data rate of 10 Gbit/s. 10GBASE-T is one such standard used to provide 10 gigabit per second connections over unshielded or shielded twisted pair cables. FIG. 1 illustrates a standard 10GBASE-T architecture, with respective first and second network devices 110a and 110b communicating via transceiver circuits 112a and 112b over a link 106. The wire-level modulation for 10GBASE-T is a Tomlinson-Harashima Precoded (THP) version of pulse-amplitude modulation with 16 discrete levels (PAM-16), encoded in a two-dimensional constellation pattern known as 128-DSQ (Double Square QAM).

As shown in FIG. 2, the 10GBASE-T transport frame is based on a (2048, 1723) Low Density Parity Check (LDPC) code, i.e. 2048 total bits with 1723 data bits and 325 check bits per frame, where the check bits are used to fix or detect errors in the frame. This is used in combination with the 128-DSQ synthetic constellation that uses a combination of coded and uncoded bits to transmit information. As shown, Ethernet data is retrieved in fifty 65-bit blocks and is scrambled, e.g. provided to a self-synchronizing scrambler to scramble the bits, and a CRC-8 generation of 8 check bits is provided on one end of the frame and an auxiliary channel bit on the other end, creating 3259 bits in the frame payload. The payload is then divided up into 1723 bits for the LDPC coder, and 1536 uncoded bits (3×512) that are not coded by the LDPC coder. The coded LDPC check bits (325 bits) are added to the end of the payload. The LDPC block size after coding is 2048 total bits (4×512).

The resulting frame is mapped to 128-DSQ symbols, and the resulting DSQ symbols are then precoded using THP. Each of these 512 128-DSQ symbols are then transmitted as a pair of PAM-16 symbols (x-axis and y-axis), to create 1024 symbols (3584 bits). The constellation for 128-DSQ symbols is shown in FIG. 3, and consists of 8 cosets (regions), each coset containing 16 points. The coset label contains the 3 uncoded bits as shown in FIG. 3, and the points within the coset contain the 4 coded bits protected using the LDPC block code. The labeling of the points in the coset (the coset elements) conveying the 4 coded bits is also shown in FIG. 3.

The receiver unscrambles a received frame and decodes the coded bits. Any of several decoding algorithms for LDPC codes can be used in the receiver to decode the received coded bits. For example, iterative decoders are often used to converge on a correct decoded value. In one implementation, LDPC decoding is performed in the receiver using a soft-decision, message-passing algorithm. The bits are treated as continuous variables which represent the probability of the value being a 0 or a 1, and the continuous variables are represented in the decoding algorithm as Log Likelihood Ratios (LLRs). The message passing algorithm sets the variable nodes to the soft receive LLRs, calculates the syndrome LLRs given the variable LLRs, updates the variable LLRs with the new syndrome information, and iterates in this same way until a convergence is reached (e.g., check bits are zero). Using the 10GBASE-T transmission scheme, it is possible to have very low bit error rates that come very close to the Shannon limit of the communication channel.

While the transmission scheme described above works well for its intended applications, it would be desirable to utilize the 10GBASE-T frame structure for data rate transmissions that are less than 10 Gbps, such as 5 Gbps or lower.

BRIEF DESCRIPTION OF THE DRAWINGS

FIG. 4 illustrates one embodiment of a PAM8 modulation involving coset partitioning.

FIG. 5 illustrates one embodiment of a PAM8 modulation involving Gray coded bits.

DETAILED DESCRIPTION

Figure 1:
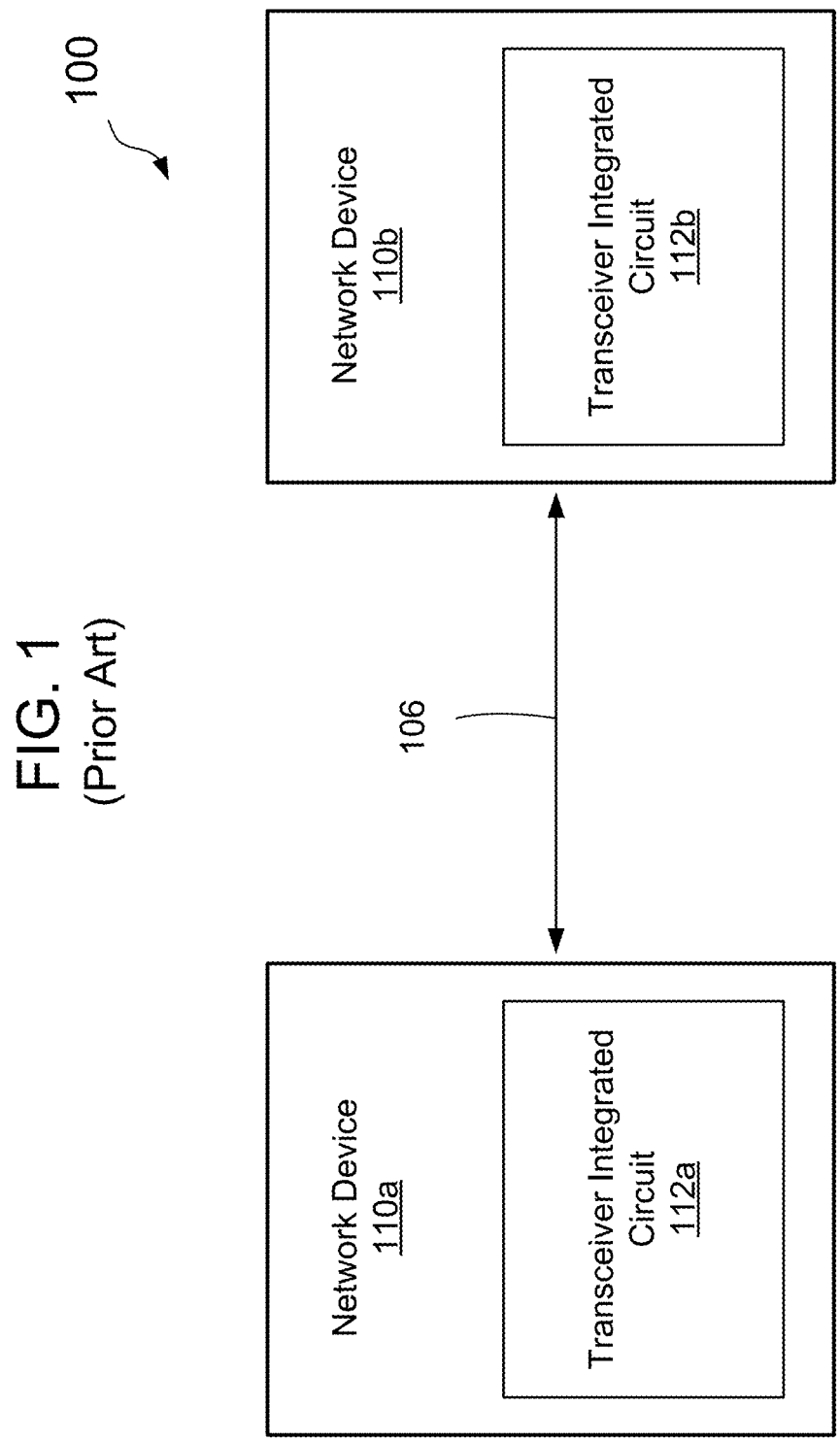
FIG. 1 illustrates a 10GBASE-T signaling link bounded by respective transceivers.
Figure 2:
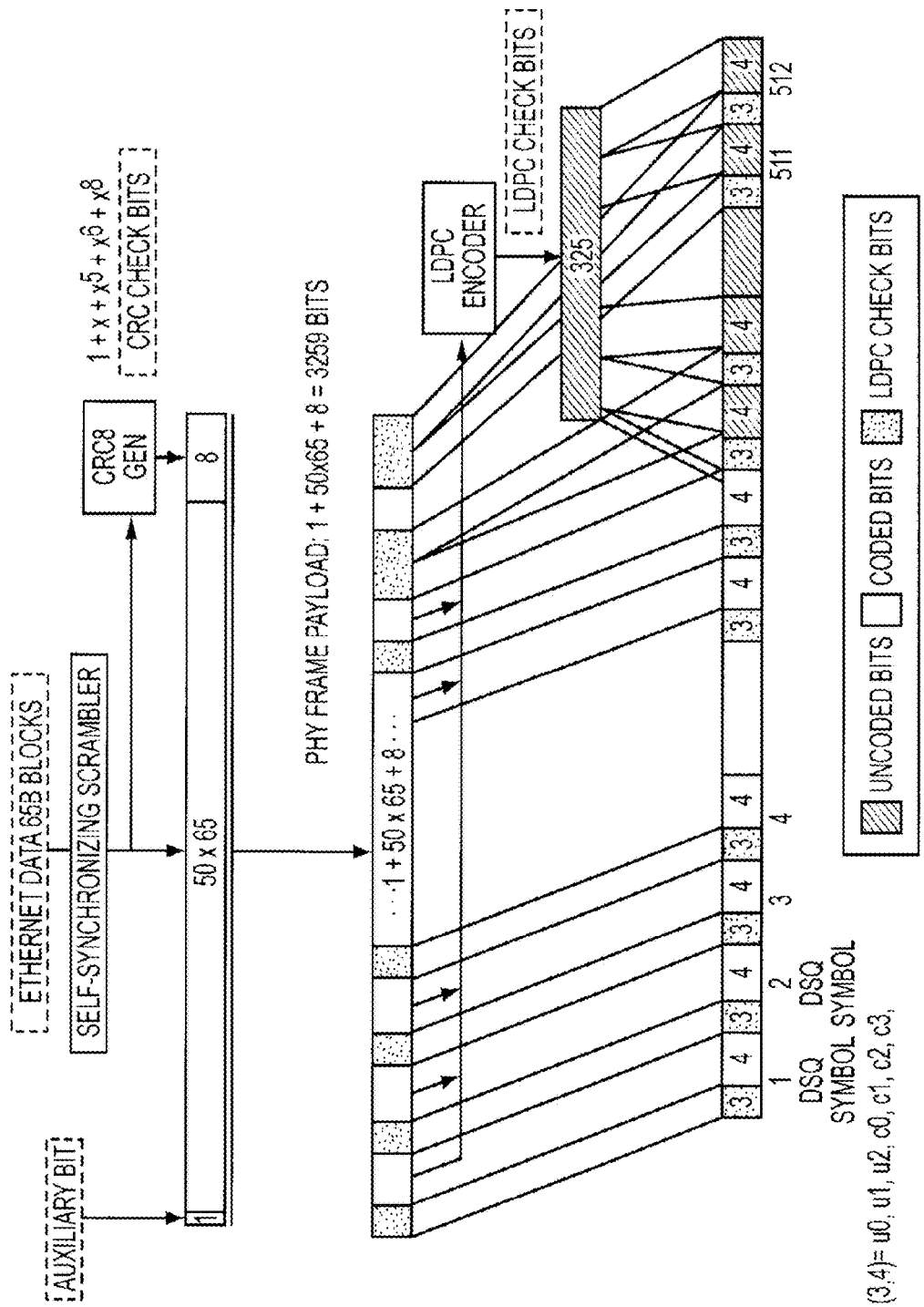
FIG. 2 illustrates a transmission frame for the 10GBASE-T communication standard.
Figure 3:
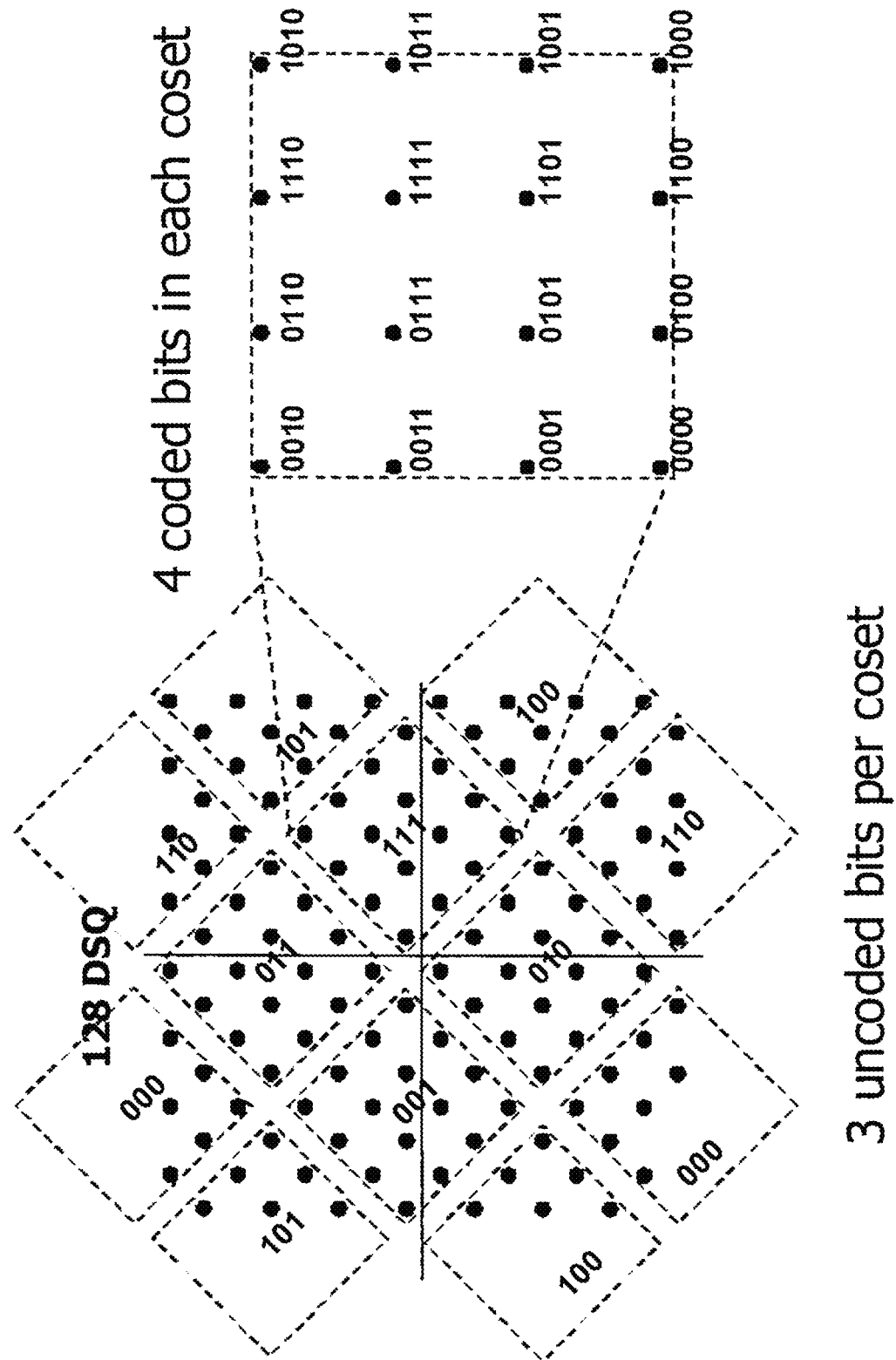
FIG. 3 illustrates a constellation for 128-DSQ modulation used in the standard of FIG. 2 and the labeling of points in a coset used with the constellation.

Embodiments of methods of signaling along a high-speed Ethernet link are disclosed. In one embodiment, a BASE-T Ethernet transceiver is disclosed. The transceiver includes a BASE-T Ethernet transmit circuit that employs a data framing module. The data framing module includes an input interface to receive Ethernet block data bits, and a forward error correction encoder coupled to the logic to encode at least a first portion of the data bits to generate first error check bits. A Reed-Solomon (RS) encoder is coupled to the logic to encode at least a second portion of the data bits in accordance with a Reed-Solomon error code to generate second error check bits. A symbol mapper modulates the Ethernet block data bits in accordance with an SQ64 constellation comprising back-to-back PAM8 symbols.

The inventor has discovered that by re-organizing the various groups of bits in a given 10GBASE-T transport frame, utilizing sparser constellations such as PAM8 frees up bits within the frame, thus enabling the use of error detection correction coding such as Reed-Solomon coding that may utilize the additional bit locations in the frame. This adds significant coding gain to the frame for more robust data transmissions.

In PAM8 modulation, every 8-level symbol represents 3 bits of data. FIG. 4 illustrates one embodiment of a PAM8 constellation using Coset Partitioning, where there are 2 LSB bits ($b_1$ and $b_0$) within each of two Cosets, at 402 and 404 that are identified by 1 MSB bit ($b_2$). The hamming distance between points in this constellation is ⅐th of the full scale amplitude, or effectively ~18 dB (at best 17 dB) less than a PAM2 modulation. So it is important to use forward error correction (FEC) for a reliable low BER (bit error rate) communication over a channel that is subject to relatively large amount of external noise sources that are unknown to the transceiver and cannot be cancelled. This approach provides the flexibility to have LSB bits (having smaller SNR margin of 18 dB below full scale) to be coded with a high-gain FEC with higher overhead (e.g. LDPC), while the MSBs (having higher SNR margin) can be left uncoded or have simpler FEC with lower SNR gain and overhead (e.g. Reed Solomon codes).

FIG. 5 illustrates an alternative approach that employs Gray coding to code all 3 bits ($b_2$, $b_1$, $b_0$) for mapping to the 8 levels (07, 05, 03, 01, −01, −03, −05, −07) and encode/decode all bits of a symbol together in a single FEC scheme like LDPC. The advantage of this approach is that, while combining the high SNR MSB with LSBs for coding increases the coding gain of the FEC (by as much as 1 dB extra coding gain), the Gray coding of the 2 LSBs over the 8 levels leads to fewer transitions between 1s and 0s in the mapping of the second LSB $b_1$. This reduces the probability of errors. However, using the same coding for MSBs as that of LSBs dictates the same coding overhead as LSBs, while it may not be necessary in all cases. Additionally, the 3 bits per PAM symbol complicates the efficient grouping and framing for the FEC in the implementation phase.

Referring back to the Coset Partitioning approach shown in FIG. 4, for one embodiment, the LSBs may be decoded first on the receiver side and using the decoded LSB information, we can slice the MSBs to achieve a higher SNR gain, which in the case of PAM8 in FIG. 4 is 12 dB. Basically, once we know the LSB value within the Coset post FEC decoder, we remove all other LSB combinations in the Cosets and the remaining point in every Coset will have 2N times the distance between the original LSB points (where N is the number of LSB bits in the Coset, which in this case N=2). Therefore, in the case of PAM8 Coset partitioning of FIG. 4, the remaining points will have 4× the LSB distance or 12 dB larger SNR margin. An example is shown in FIG. 4 where the distance between points represented by decoded LSB bits "01" are at 4× the minimum distance between LSBs.

Although MSB points have generally large SNR margins, in certain environments where there are large impulse noises, they may also get corrupted. So depending on the use cases and environments that the target communication channel is deployed, the coding scheme may need to adequately protect MSBs as well. The amount of protection may generally be determined by the length of symbols that an impulse event is large enough to corrupt the symbols MSBs. Typically, the nature of such impulses is contained in time and corrupts a certain group of back to back symbols in a channel, as opposed to fully-random white Guassian noise.

Figure 6:
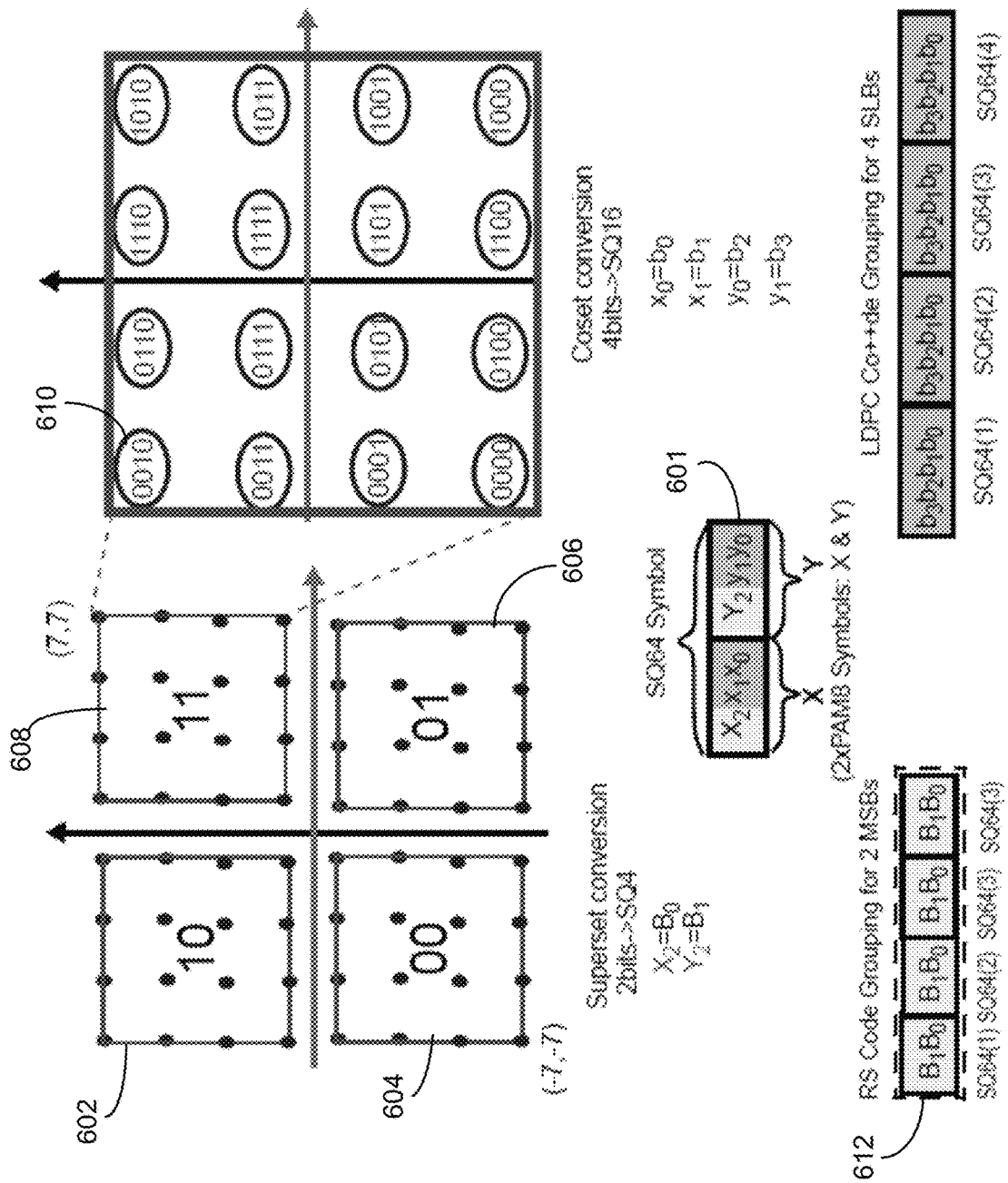
FIG. 6 illustrates one embodiment of an SQ64 constellation and LDPC/RS code groupings for LSBs and MSBs.

FIG. 6 illustrates a grouping of the above PAM8 constellations in the form of 64SQ. The 64SQ constellation is effectively formed by two back-to-back Coset partitioned PAM8 symbols, such as symbols X and Y at 601. Thus, each 64SQ symbol carries (2×3) 6 bits of data. The 64SQ constellation can be viewed as 4 subsets (4 Cosets) at 602, 604, 606 and 608 of SQ16 points identified by 4 bits of LSB, such as at 610. The hamming distance between the SQ16 LSB points in the Coset (point inside the squares) are also about ~18 dB (at best 17 dB) less than a full scale similar to that of PAM8. Each one of the 4 nodes in the SQ4 constellation of Cosets, identified by MSB bits, has a hamming distance that is 12 dB better than LSB points inside the Coset. With strong FEC coding like LDPC used on Coset LSB points with 10-12 dB SNR gain, the LSB points within the Coset and MSB points will have similar SNR on the receive side. Again, similar to the Coset partitioned PAM8 scheme, the LSBs are encoded/decoded by strong FEC such as LDPC, and for robust protection to large impulse noise source, the MSBs are FEC encoded as well. The choice of FEC coding for MSBs in the proposed scheme here is Reed-Solomon (RS coding), because it has lower overhead. RS coding corrects blocks of bits, as opposed to LDPC FEC that corrects any error bit location, within the code frame. This characteristic of the RS code matches well with nature of the impulse noises that corrupt groups of consecutive symbols at a time. In the example shown in FIG. 6, at 612, the proposed RS block is 8 bits long and the associated LDPC parity bits for a scenario where all bits within symbols are coded together by a single FEC.

Figure 7:
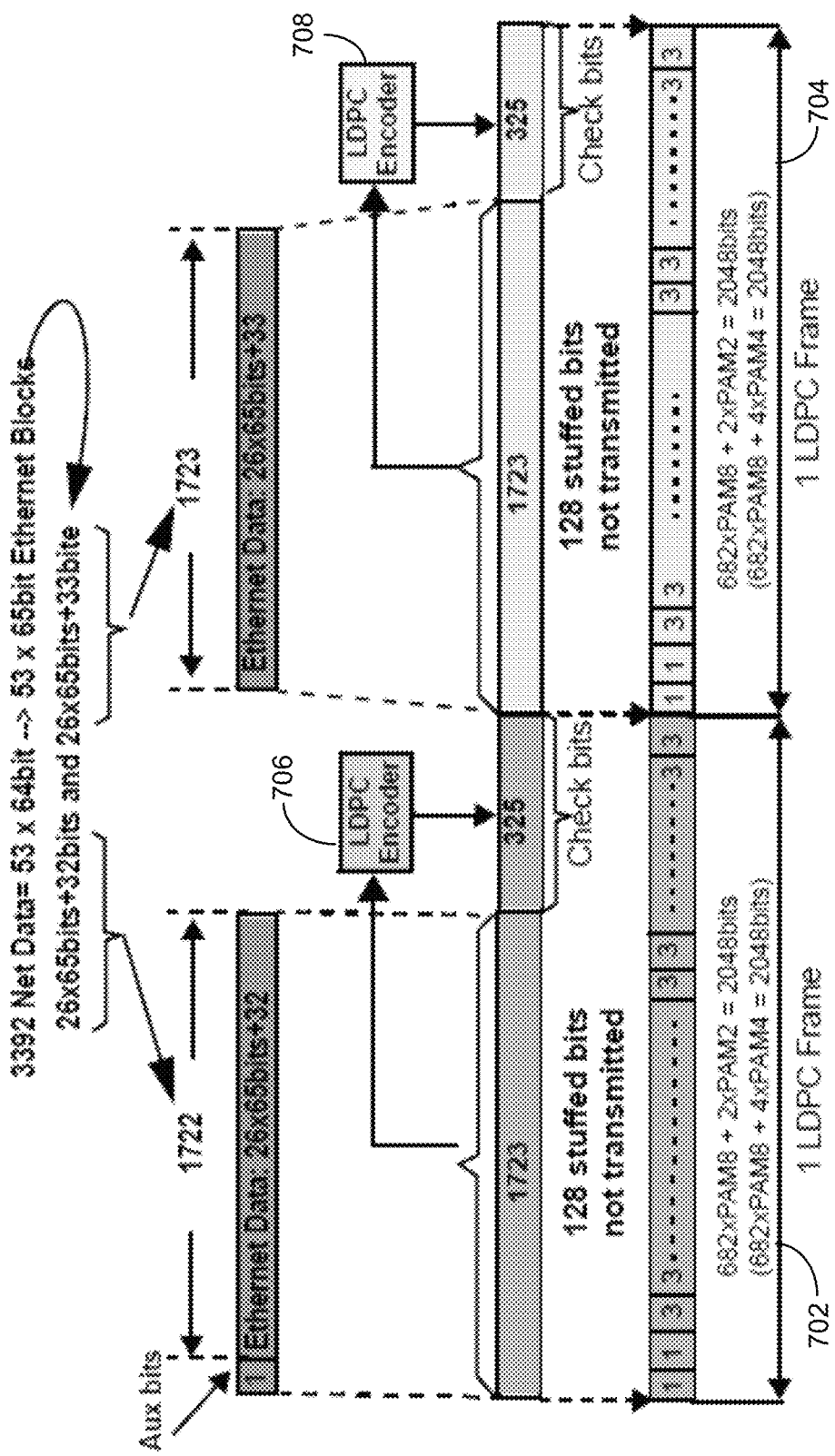
FIG. 7 illustrates one embodiment of a transmission frame and bit allocations with all bits of PAM8 symbols LDPC coded together.

Referring to FIG. 7, for one embodiment, we have considered the LDPC (1723, 2048) frame format as proposed for the 10GBASE-T standard. To make more efficient use of the channel bandwidth given the Ethernet 64/65 coding, one of the Ethernet 65-bit blocks is split between two LDPC frames. The blocks of data are LDPC encoded by respective LDPC encoders 706 and 708, involving 325 check bits for each frame. For each LDPC frame, at 702, the symbols are grouped into 682×PAM8 and 2×PAM2 (or 680×PAM8 and 4×PAM4) to transmit a net 2048 bits per LDPC Frame. In the case of BASE-T applications where the channel has 4 pairs, the number of symbols per frame is selected to be divisible by 4 such that each frame is divided properly into the 4 lanes. In this scheme, the net input data bit to the system are 3392 that are transferred over 1368 symbols. Therefore, the net data throughput for this system with all bit decoded the same is Transmission Efficiency (All LDPC Coded)=3392/1368=2.479 bits/Symbol If we want to get an effective 5 Gbps throughput from it over a BASE-T channel, with four pairs running full-duplex, we would need a symbol rate of:

Symbol Rate=5 Gbps/(4×2.479)=~505 MS/s

Figure 8:
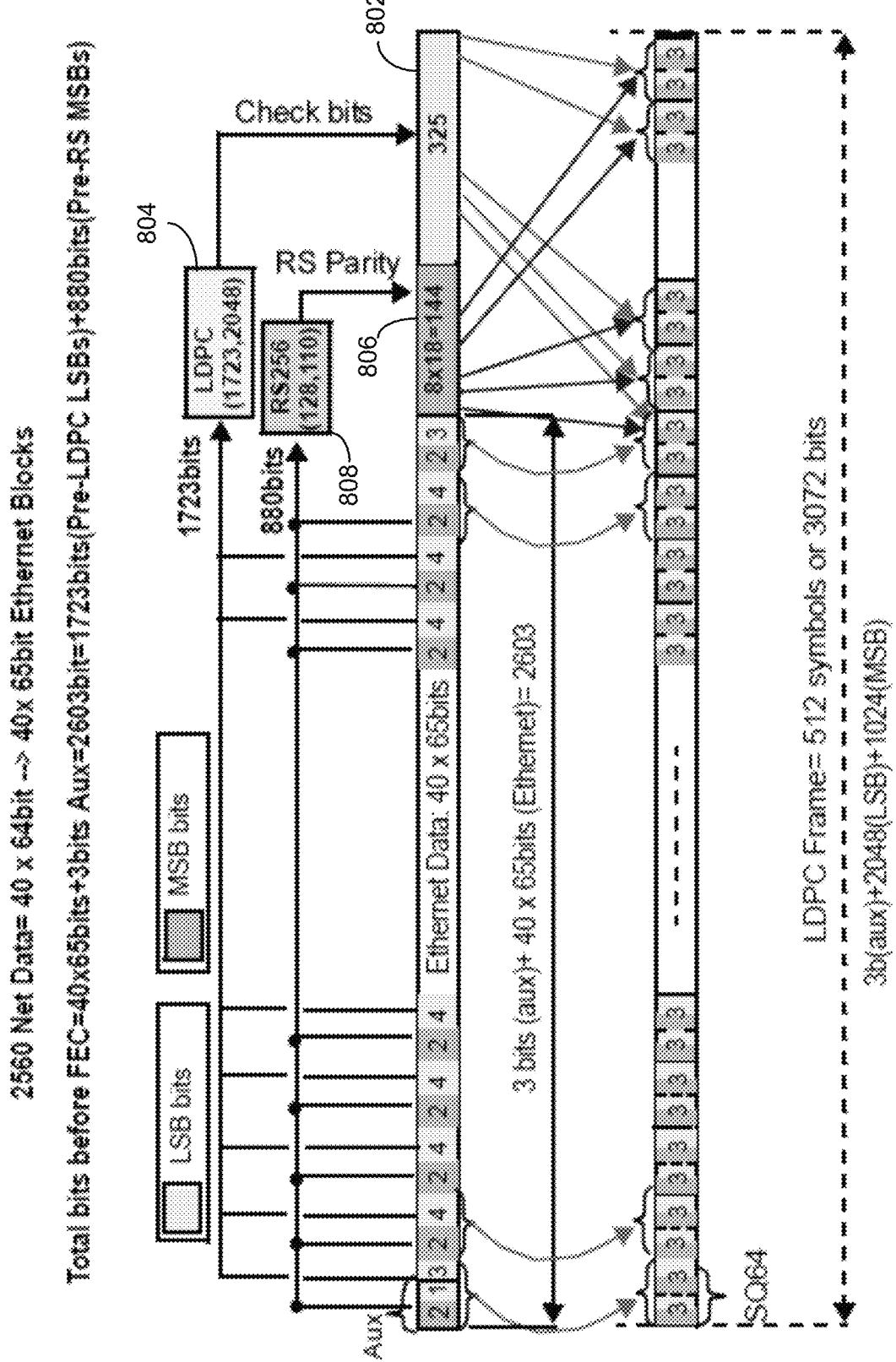
FIG. 8 illustrates one embodiment of a transmission frame and bit allocations with LSBs LDPC coded and MSBs RS coded.

FIG. 8 illustrates one embodiment of a grouping of 2560 data bits in form of 40×65 bit Ethernet data and an associated set of 325 LDPC parity bits, at 802, generated by LDPC encoder 804, for the set of bits that are going to be assigned to LSBs in the symbols. An associated set of 144 RS correction bits (18×8 bits), at 806, are generated by an RS encoder 808 for bits that are going to be assigned to MSBs in the symbols. In this example, we have again considered the LDPC (1723,2048) as proposed for the 10GBASE-T standard. The RS coding proposed here is RS256 (128,110) that uses a block size of 8 bits and has 18 correction blocks, therefore, it can correct up to nine 8-bit blocks that are in error.

As an overview, Reed-Solomon error coding schemes are block-based error control codes, built using Galois field elements. Galois fields can be constructed from powers of prime numbers. $2^N$ is a very popular choice, which leads to a maximum block size of $2^N-1$ symbols. For example, $2^8$ gives a maximum block size of 255 bytes. The general format is M data symbols plus 2T check symbols.

For Reed-Solomon codes, the 2T check symbols can locate and correct T errored symbols, and detect the presence of 2T errored symbols. One way to look at this is that for each errored symbol, we need one symbol to locate the error within the block, and another symbol to contain the correction. The code is described as $RS2^N$ ("Total symbols", "Payload symbols"). For example, the code RS256 (128, 110) would have 110 payload bytes in a frame with 18 check bytes capable of correcting 9 bytes in the frame. The optimal RS block size is usually chosen such that $2^N$ symbols are just slightly larger than the number of symbols you have to correct. This generally maximizes the number of correctable symbols within the block.

As noted, the FEC overhead for the MSB bits are less than half that of the LSB bits (144/325=0.44). In the case of BASE-T applications that the channel has 4 pairs, the number of symbols per frame is selected to be divisible by 4 such that each frame is divided properly into the 4 lanes as explained earlier. In this scheme, the net input data bits to the system are 2560 that are transferred over 512 SQ64 (or 1024 PAM8) symbols. Therefore, the net data throughput for this system with all bit decoded the same is Transmission Efficiency (LDPC+RS Combo)=2560/
1024=5 bits/SQ64=2.5 bits/PAM8

If we want to get an effective 5 Gbps throughput from it over a BASE-T channel, with four pairs running full-duplex, we would need a symbol rate of:

Symbol Rate=5 Gbps/(4×2.5)=500 MS/s

So although the overhead of the RS code for the MSBs is ~40% that of a LDPC code, the final net data throughput between the two schemes only leads to <1% difference. This 1% is a fair price to pay to gain an additional 1 dB of coding gain for the first case of Gray-coded PAM8 with all bits LDPC decoded. However, there are other considerations for the final selection of the modulation and FEC framing scheme. For example, in a BASE-T application that the PHY needs to be interoperable with all legacy speed modes, switching to a random frame time may complicate the system clocking boundaries and thus extra hardware and elastic buffers to address the rate and clock mismatch.

Figure 9:
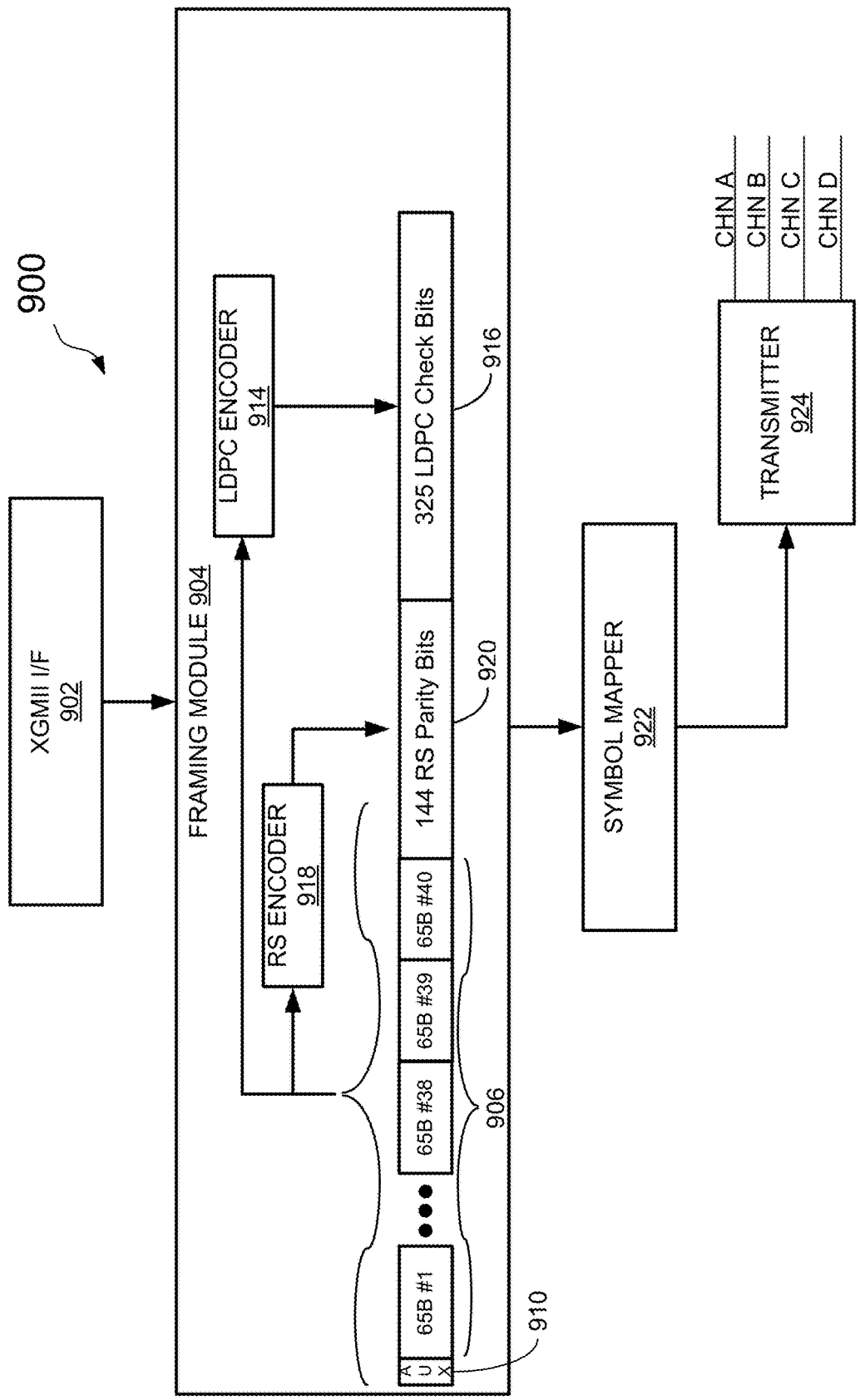
FIG. 9 illustrates one embodiment of a BASE-T transceiver that employs a framing module in accordance with one embodiment.

FIG. 9 illustrates one embodiment of a BASE-T transceiver, generally designated 900, that employs a framing module 904 to generate a unique transport frame consistent with the transport frame described above for high-speed Ethernet data transmissions. Further referring to FIG. 9, one embodiment of the transceiver 900 includes a 10 Gigabit Media Independent Interface (XGMII) 902 that interfaces the transceiver 900 to a media access controller (MAC), not shown. The XGMII interface 902 then feeds the data to the framing module 904. The framing module, consistent with the description above with respect to FIG. 8, aggregates a certain amount of the data as a payload, for example, forty 65B frames, at 906, together with three auxiliary bits, at 910. For each 6-bit symbol, 4 of the bits are passed to an LDPC encoder 914 to generate 325 LDPC check bits, at 916. Three bits from each 6-bit symbol are passed to a Reed-Solomon encoder 918 to generate 144 Reed-Solomon check bits, at 920. For one specific embodiment, the Reed-Solomon check bits are in accordance with a Reed-Solomon code such as RS256 (128, 110), which includes 144 check bits that are capable of correcting, for example, 9 data payload bytes in the frame.

With continued reference to FIG. 9, each transport frame generated by the framing module 904 is mapped into plural symbols by a symbol mapper 922. For one specific embodiment, the symbols are in the form of back-to-back PAM-8 symbols, each symbol having a total of 6 bits (4 coded via LDPC, 2 uncoded), creating an SQ64 constellation. The uncoded bits that are associated with the SQ64 constellation are nevertheless protected by the Reed-Solomon check bits provided in the transport frame.

The symbols are then transmitted at a desired symbol rate by a transmitter 924 across plural physical channels CHN A, CHN B, CHN C and CHN D. The transmit symbol rate for one embodiment may be matched to the expected rated bandwidth (half the symbol rate) of the physical channels provided by the cable. Other data rates may be utilized by varying the symbol rate and/or the symbol mapping scheme.

At the receive side of the channel, an inverse process is carried out by a receiver link partner to retrieve the data and to decode the contents. The Reed-Solomon coding described above enables for corrections to up to nine 8-bit blocks that are in error, while still utilizing the transport frame corresponding to the 10GBASE-T standard.

Those having skill in the art will appreciate the many benefits and advantages afforded by the embodiments presented herein. Of significant benefit is the ability to reuse 10GBASE-T transport frame structures for data rates that are less than 10 Gbps.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., ' ') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A BASE-T Ethernet transceiver comprising:
    a BASE-T Ethernet transmit circuit including
        a BASE-T Ethernet data framing circuitry including
            an input interface configured to receive an Ethernet block of data bits for transmission over an Ethernet interface to a receiver,
            forward error correction (FEC) encoder circuitry coupled to the input interface and configured to encode the Ethernet block of data bits to generate error correction information for use by the receiver to correct errors in a received Ethernet block of bits; and
        a symbol mapper configured to modulate the Ethernet block of data bits and the error correction information into multiple back-to-back PAM8 symbols in accordance with a 64SQ symbol constellation, the 64SQ constellation forming a square grid of sixty-four constellation points.

2. The BASE-T Ethernet transceiver of claim 1, wherein the FEC encoder circuitry comprises a Low Density Parity Check (LDPC) encoder coupled to the input interface to encode a first portion of the Ethernet block of data bits to generate error correction information defined by error check bits.

3. The BASE-T Ethernet transceiver of claim 2, further comprising a Reed-Solomon encoder coupled to the input interface to encode a second portion of the data bits other than the first portion in accordance with a Reed-Solomon error correction code.

4. The BASE-T Ethernet transceiver of claim 3, wherein the Reed-Solomon error correction code comprises an RS256 (128, 110) error code.

5. The BASE-T Ethernet transceiver of claim 3, wherein the BASE-T Ethernet transmit circuit further comprises:
    a transmitter to transmit the back-to-back PAM8 symbols at a symbol rate within the range of 500 MS/s-505 MS/s.

6. The BASE-T Ethernet transceiver of claim 1, wherein the first portion of the data bits comprise least-significant bits (LSBs) of the Ethernet block data bits.

7. The BASE-T Ethernet transceiver of claim 1, wherein the second portion of the data bits other than the first portion comprise most-significant bits (MSBs) of the Ethernet block data bits.

8. A method of transferring Ethernet data, the method comprising:
    framing BASE-T Ethernet data including
        receiving an Ethernet block of data bits for transmission over an Ethernet interface to a receiver,
        encoding the Ethernet block of data bits in accordance with a forward error correction (FEC) code to generate error correction information for use by the receiver to correct errors in a received Ethernet block of bits; and
    modulating the Ethernet block of data bits and the error correction information into multiple back-to-back PAM8 symbols in accordance with a 64SQ symbol constellation, the 64SQ constellation forming a square grid of sixty-four constellation points.

9. The method according to claim 8, wherein encoding the first portion of the data bits in accordance with an FEC code comprises:
    encoding a first portion of the Ethernet block of data bits in accordance with a Low Density Parity Check (LDPC) code to generate error correction information defined by error check bits.

10. The method according to claim 8, further comprising:
    encoding a second portion of the data bits other than the first portion via a Reed-Solomon error correction code.

11. The method according to claim 10, wherein the encoding of the second portion of the data bits comprises:
    encoding the second portion of the data bits via an RS256 (128, 110) error code.

12. The method according to claim 10, wherein the encoding of the second portion of the data bits other than the first portion comprises:
    encoding most-significant bits (MSBs) of the Ethernet block data bits.

13. The method according to claim 8, wherein the modulating further comprises:
    generating each PAM8 symbol as a set of coset partitioned bits having unique least-significant bits (LSBs) and a most-significant bit (MSB) shared by multiple sets of coset partitioned bits.

14. The method according to claim 13, wherein the generating each PAM8 symbol as a set of coset partitioned bits comprises:
    generating each PAM8 symbol as a set of coset partitioned bits having unique least-significant bits (LSBs) and a most-significant bit (MSB) shared by multiple sets of coset partitioned bits.

15. The method according to claim 8, wherein the modulating further comprises:
    generating each PAM8 symbol as a set of Gray coded bits.

16. The method according to claim 8, further comprising:
   transmitting the PAM8 symbols at a symbol rate within the range of 500 MS/s-505 MS/s.

17. The method according to claim 8, wherein encoding the first portion of the data bits in accordance with a forward error correction (FEC) code to generate error information comprises:
   encoding least-significant bits (LSBs) of the Ethernet block data bits.

\* \* \* \* \*